United States Patent

Marshall

(10) Patent No.: US 7,960,760 B2
(45) Date of Patent: Jun. 14, 2011

(54) ELECTRICALLY PROGRAMMABLE FUSE

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 11/616,938

(22) Filed: Dec. 28, 2006

(65) Prior Publication Data

US 2008/0157201 A1 Jul. 3, 2008

(51) Int. Cl.
*H01L 23/52* (2006.01)
(52) U.S. Cl. ............ 257/209; 257/529; 257/E21.592; 257/E23.149
(58) Field of Classification Search .......... 257/209, 257/529, E23.149, E21.592
See application file for complete search history.

(56) References Cited

U.S. PATENT DOCUMENTS

| 6,933,591 | B1 | 8/2005 | Sidhu et al. | |
|---|---|---|---|---|
| 7,067,359 | B2 * | 6/2006 | Wu | 438/132 |
| 2002/0197781 | A1 * | 12/2002 | Bryant et al. | 438/199 |
| 2003/0193058 | A1 * | 10/2003 | Fried et al. | 257/200 |
| 2005/0173740 | A1 * | 8/2005 | Jin | 257/288 |

OTHER PUBLICATIONS

Xuejue Huang, et al., "Sub-50 nm P-Channel FinFET" IEEE Transactions on Electron Devices, vol. 48, No. 5, pp. 880-886, May 2001.

* cited by examiner

*Primary Examiner* — Bradley K Smith
*Assistant Examiner* — Mohammad T Karimy
(74) *Attorney, Agent, or Firm* — Warren L. Franz; Wade J. Brady, III; Frederick J. Telecky, Jr.

(57) ABSTRACT

A semiconductor device includes a fin-fuse and an SOI transistor. The SOI transistor is located on an SOI substrate and has a source region and a drain region. The fin-fuse is connected to one of the source/drain regions and has a fusible link located on the SOI substrate. The fusible link has a homogeneous dopant concentration.

12 Claims, 7 Drawing Sheets

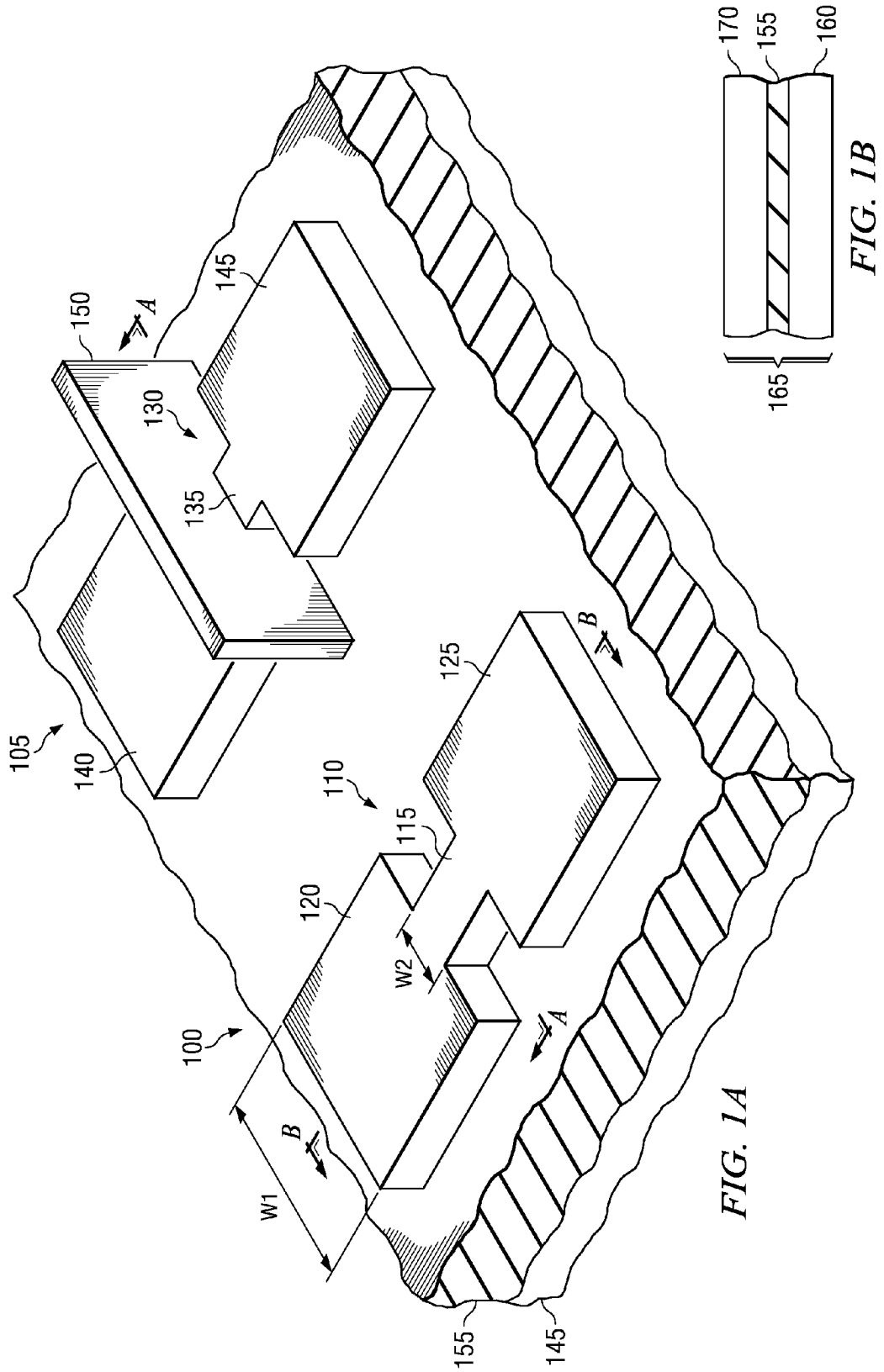

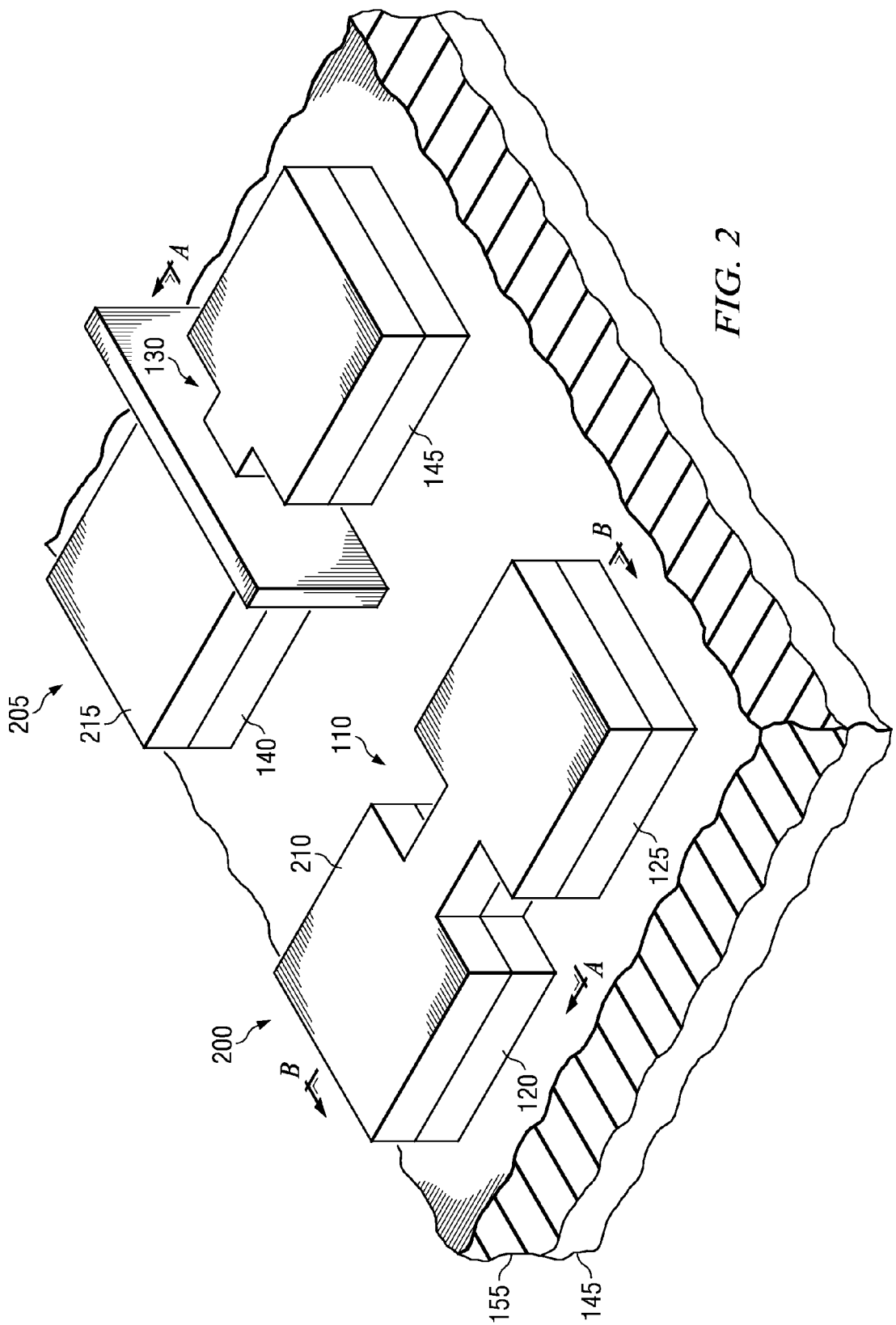

ELECTRICALLY PROGRAMMABLE FUSE

TECHNICAL FIELD

The embodiments discussed herein are directed, in general, to fuses, and, more specifically, to an electrically programmable fuse with applications to integrated circuits.

BACKGROUND

The pursuit of increasing quality, productivity, and product yield within the semiconductor manufacturing industry is an ongoing endeavor. To that end, the industry has developed techniques to improve operative yield by "trimming" or electrically removing inoperable or defective memory or other circuits from the main circuit. In such instances, the integrated circuit also includes redundant memory arrays or circuits that are laid out so that they can be electrically incorporated into the integrated circuit design when the defective portions are detected. In the event that a given memory block is defective, that block can be effectively "trimmed" or electrically removed from the circuit. A fuse or a group of fuses are "blown" to a high-resistance state such that the defective memory block or circuit is electrically isolated from the remaining circuit. A logic algorithm may then be used to direct the data stream to the redundant memory block or circuit.

Electrically programmable fuses typically include a fusible link formed from a polysilicon layer. As the size of semiconductor device features continues to shrink (or "scale") the relative thickness of the polysilicon layer has generally been increasing to reduce the resistivity of conductive features formed therefrom. Because the resistivity of the polysilicon layer is not scaling at the same rate as the transistors, a relatively larger transistor is now needed to blow the fuse. Thus, an increasing fraction of the total required area of an integrated circuit design is consumed by the fuse-blowing transistors. This use of area leads to device designs that are larger than they would otherwise be, reducing the number of devices that may be placed on a wafer.

Accordingly, what is needed in the art is an improved fuse that overcomes the aforementioned deficiencies of the prior art.

SUMMARY

To address the above-discussed deficiencies of the prior art, there is provided, in one embodiment, an electrically programmable fuse for use in a semiconductor device. The fuse includes a transistor having a transistor body formed of a crystalline semiconductor layer over and in contact with an SOI substrate. A programming circuit is connected to a gate of the transistor, and a sense circuit is connected to a source or a drain of the transistor. A terminal of a fuse is connected to the source or drain. The fuse includes a fin formed of the crystalline semiconductor layer on the SOI substrate, and the fin has a substantially homogeneous dopant concentration.

Another embodiment is a semiconductor device including an SOI transistor and a fin-fuse. The SOI transistor is located on an SOI substrate and has a source region and a drain region. The fin-fuse is connected to one of the source/drain regions and has a fusible link located on the SOI substrate. The fusible link has a homogeneous dopant concentration.

Another embodiment is a method of forming a fuse for use in a semiconductor device. The method includes forming a transistor body of an SOI transistor on an SOI substrate, and includes forming source/drain regions of the transistor. A fusible link located on the SOI substrate is formed simultaneously with the transistor body. The fusible link has a homogeneous dopant concentration.

BRIEF DESCRIPTION OF THE DRAWINGS

Reference is now made to the following descriptions taken in conjunction with the accompanying drawings, in which:
FIGS. 1 and 2 illustrate embodiments of a fuse.

DETAILED DESCRIPTION

Figure 3A:
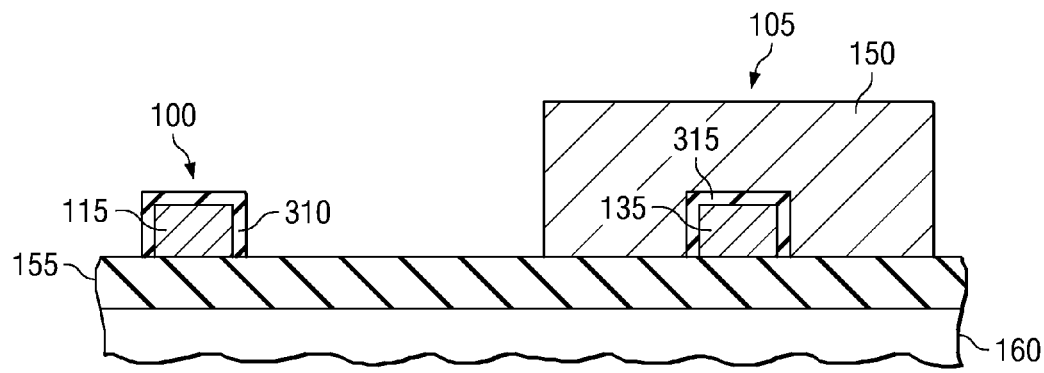
FIGS. 3A-3C illustrate embodiments of a dielectric layer on sidewalls of an fuse.

Electrically programmable fuse design limitations related to technology scaling may be addressed by manufacturing a fusible link of the fuse using the same semiconductor level that is used to form a sink transistor used to blow the link. When the fuse is formed in this manner, the current required to blow the link is expected to scale at approximately the same rate as the unit drive capacity of the sink transistor. Thus, the sizes of the link and the sink transistor relative to each other will not change significantly as the technology is scaled, and the area dedicated to sink transistors in an integrated circuit is reduced from what it would otherwise be.

FIG. 1 illustrates an embodiment of a fin-fuse 100 and an SOI transistor 105. The fin-fuse 100 includes a fuse body 110 that includes a fusible link 115 and optional pads 120, 125. The SOI transistor 105 is shown as a finFET, but could be any currently known or future type of transistor fabricated on an SOI substrate. In some cases, for example, the SOI transistor 105 is a planar SOI transistor. Generally, a body of the transistor 105 includes those portions of the transistor formed of a crystalline semiconductor, such as source, drain and channel regions. In the illustrated embodiment, the SOI transistor 105 has a transistor body 130 that includes a fin 135 (so named because it generally has a high aspect ratio, causing it to resemble a fin), a source/drain 140 and a source/drain 145, and is comprised of a single-crystal semiconductor material. The SOI transistor 105 further includes a gate electrode 150, which may be any electrode material appropriate to the transistor technology used. In some cases, the electrode 150 may be formed from polysilicon or a metal. The transistor body 130 and the fuse body 110 are formed on a dielectric layer 155, so the transistor body 130 and the fuse body 110 are substantially coplanar.

In certain embodiments, "fusible" may describe the capacity of a resistive element to be irreversibly transformed from a relatively low resistance state to a relatively high resistance state. In some cases, the higher resistance will be essentially an electrical open, i.e., 1 MΩ or greater.

In one embodiment, the fusible link 115 may by formed from a same single-crystal semiconductor layer as the transistor body 130. In some such cases, the link 115 is a single-crystal semiconductor. In these cases, the link 115 and the transistor body 130 may have substantially the same crystallographic orientation. Restated, crystallographic indexes (Miller indexes, e.g.) of the crystal lattices of the fuse body 110 and the transistor body 130 are substantially aligned. The word "substantially" here means that the crystallographic orientation of the materials is the same except for crystal orientation imperfections that can be present in any crystalline material. However, in another embodiment, the fusible link 115 may be composed of a different material than that of the transistor body 130. For example, the fusible link 115 may be an amorphous material while the transistor body 130 is a single-crystal material.

In another embodiment, the fusible link 115 has a substantially homogeneous concentration of impurity, or dopant, atoms. When present, such dopants may be undesirable impurity atoms, may be incidental to processing of unrelated devices, or may be used to produce a desired resistivity of the fusible link 115. As used herein, homogeneous means that the fusible link 115 is free of junctions and substantial discontinuities in dopant concentration in the direction of current flow I. Furthermore, the link 115 may be considered substantially homogeneous while including impurity gradients such as those resulting from surface lattice strain, entropy and similar effects. Moreover, the link 115 may have dopant gradients in a direction normal to a surface of the link 115 related to dopant implant and diffusion while still being regarded as having a substantially homogeneous concentration of impurities.

In contrast to the link 115, the fin 135 generally has a nonuniform distribution of dopant atoms. In the illustrated embodiment, e.g., the electrode 150 acts as an implant mask when forming gate junctions in the fin 135. The link 115 is not masked by an electrode, so any implant will generally affect the link 115 uniformly.

As described previously, the pads 120, 125 are optionally included in the fuse body 100. The pads 120, 125 may act as terminals of the fin-fuse 100. Other embodiments are specifically contemplated which do not include pads. In such cases, any electrical connection to the link 115 may be regarded as a terminal. In some cases, the link 115 is connected to programming circuitry by a conductive path formed on the dielectric layer 155, such as doped silicon or the gate dielectric material. When pads are present, as in the embodiment of FIG. 1, the pads 120, 125 may be any shape. In some cases, the pads 120, 125 have a width W1 greater than a width W2 of the link 115. Thus, the current density through the link 115 may be higher than the current density through the pads 120, 125 during a programming operation. In this manner, reliability of formation of a break on the link 115 may be increased.

The dielectric layer 155 may overlie a semiconductor substrate 160. In one embodiment, the dielectric layer 155 and the semiconductor substrate 160 may be a portion of a semiconductor-on-insulator (SOI) substrate 165. An SOI substrate is a semiconductor substrate having a single-crystal semiconductor layer 170 formed on the dielectric layer 155. As used herein, an SOI transistor is any transistor that includes a channel region formed from the single-crystal semiconductor layer 170.

In one aspect, the substrate 165 may be a silicon-on-insulator wafer. Alternate embodiments of the substrate 165 include, for example, configurations such as germanium-on-insulator and silicon-on-sapphire. In some cases, the semiconductor substrate 160 may be omitted when the dielectric layer 155 is thick enough to mechanically support processing of the fin-fuse 100. Without limitation, embodiments discussed herein assume silicon-on-insulator, while recognizing that other substrates may be used.

In those embodiments where single-crystal material is present, by single-crystal, it is meant that atoms in that material occupy sites of an essentially single, extended crystal lattice. In another aspect, a single-crystal material is essentially free of grain boundaries. A polycrystalline layer, being composed of domains of varying crystallographic orientation, is explicitly excluded from the definition of a single-crystal layer. However, it should be understood that in some embodiments, some of the structural elements described herein may be polycrystalline or amorphous. The single-crystal semiconductor layer 170 may include a small concentration of lattice defects such as vacancies, interstitials and dislocations while being considered single-crystal. Moreover, features formed by selective removal of portions of the single-crystal semiconductor layer 170 may substantially retain the crystallographic orientation of the single-crystal semiconductor layer 170.

FIG. 2 illustrates an alternate embodiment of a fin-fuse 200 having a dielectric layer 210 over the fuse body 110. As described below, the dielectric layer 210 may be desirable in some manufacturing process sequences. When present, the dielectric layer 210 is substantially coextensive with a lateral extent of the fuse body 110 in the plane of the dielectric layer 155. As used herein, coextensive means that the dielectric layer 210 extends substantially to the edges of the fuse body 110, but not significantly beyond, i.e., allowing for dimensional variations that can occur in manufacturing processes. In this embodiment, the dielectric layer 210 is distinguished from interlevel dielectric layers that may be formed over the fuse body 110 to insulate interconnect levels from circuit components formed on the dielectric layer 155. Such interlevel dielectrics are characterized by extending beyond the edges of underlying features, possibly covering substantially an entire substrate, and are thus not coextensive with the lateral extent of the fuse body 110. In the illustrated embodiment, a dielectric layer 215 may also be coextensive with the transistor body 130.

FIG. 3A illustrates the link 115 at section A-A of FIG. 1. A conformal dielectric layer 310 has been formed over the link 115. By conformal, it is meant that the dielectric layer 310 forms a layer of approximately uniform thickness covering surfaces of the link 115 exposed when the dielectric layer 310 is formed. Those skilled in the pertinent art appreciate that in some cases, the thickness of a conformal layer on a vertical surface of the link 115 may be 50% or less of a thickness of the layer on a horizontal surface thereof, and may still be regarded as conformal.

In the embodiment illustrated in FIG. 3A, the dielectric layer 310 covers two sides and the top of the link 115. Examples of processes that may be used to produce the conformal dielectric layer 310 include thermal oxidation of the link 115, and chemical vapor deposition (CVD) of a dielectric layer. The fin 135 may also have a conformal dielectric layer 315 formed thereon that operates as a gate dielectric. The dielectric layers 310, 315 may be formed simultaneously during a same process step. For example, the dielectric layer 310 may be formed when the dielectric layer 315 is formed as a gate dielectric layer of the SOI transistor 105. While the dielectric layer 310 may not function as a gate dielectric, it may be regarded as such when it is formed simultaneously with the gate dielectric 315.

The dielectric layer 310 may comprise any currently known or future discovered gate dielectric material. Non-limiting examples of such materials include silicon oxide, silicon nitride, silicon oxynitride, and "high-k" gate dielectrics containing hafnium or zirconium.

Figure 3B:
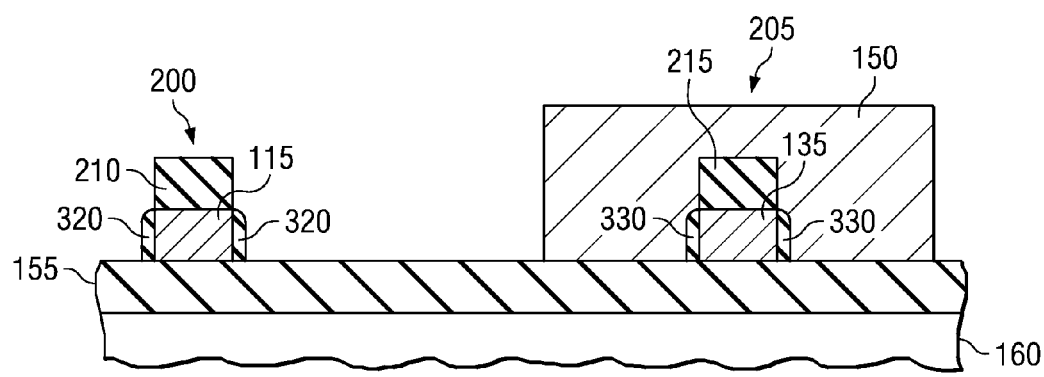
Figure 3C:
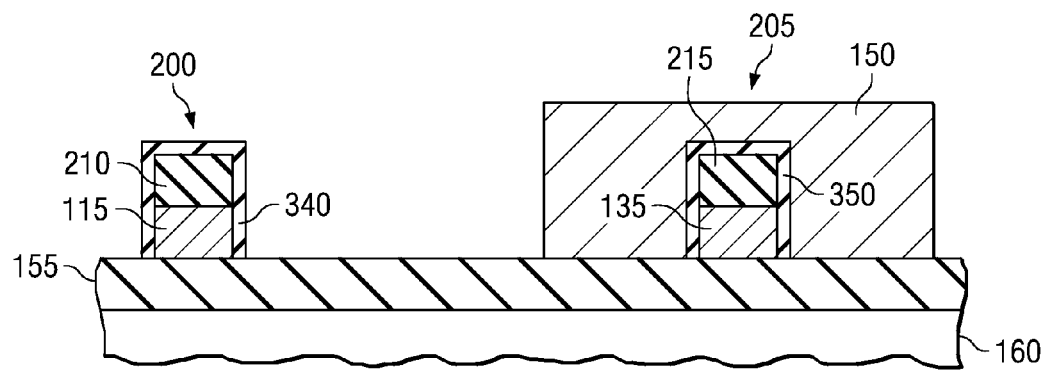

FIGS. 3B and 3C illustrate alternate embodiments of the link 115 at section A-A of FIG. 2. In FIGS. 3B and 3C, the dielectric layer 210 is present over the link 115. In FIG. 3B, sidewall dielectric layers 320 are formed on the sidewalls (vertical surfaces) of the link 115, but not over the dielectric layer 210. Such a configuration may result, e.g., from thermal oxidation of the sidewalls of the link 115 with the dielectric layer 210 present. The embodiment of FIG. 3B is conformal because the dielectric layers 320 form layers having approximately uniform thickness covering surfaces of the link 115 exposed during formation of the dielectric layer 320. As described previously, the finFET 205 may have substantially similar gate dielectric layers 330 on sidewalls of the fin 135.

In FIG. 3C, a conformal dielectric layer 340 is formed over the sidewalls of the link 115 and the sidewalls and top of the dielectric layer 210. The illustrated embodiment may be produced, e.g., by CVD deposition of the dielectric layer 340 with the dielectric layer 210 present. Again, the finFET 205 may have a substantially similar gate dielectric layer 350 formed on a sidewall of the fin 135.

Figure 4A:
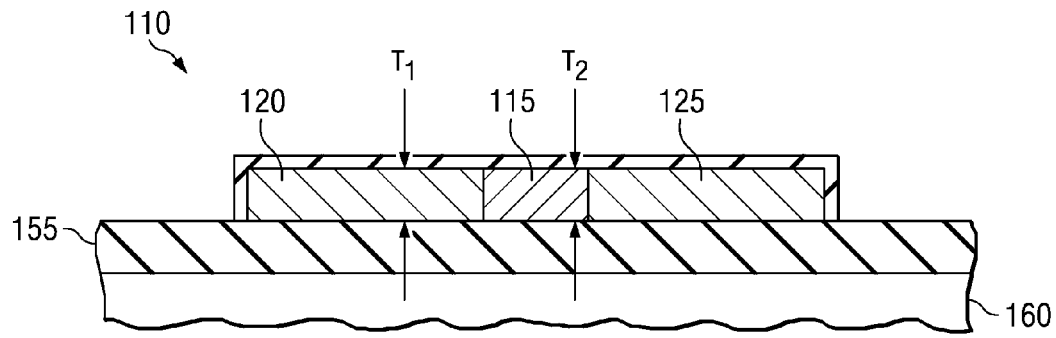
FIG. 4 illustrates embodiments of fuse link thickness.
Figure 4B:
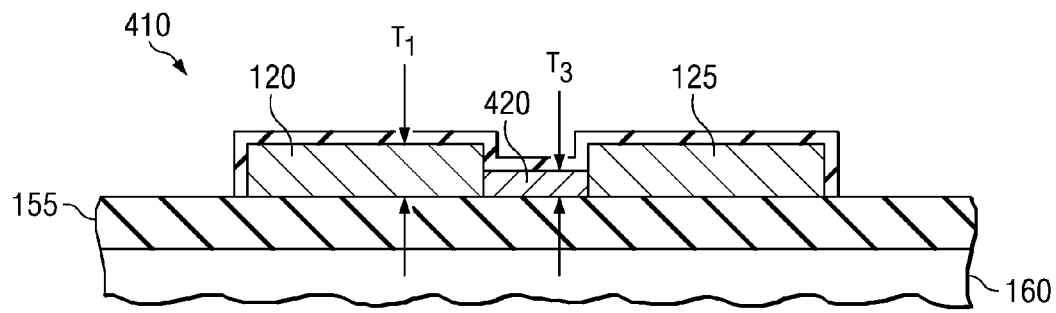

FIG. 4A illustrates the fin-fuse body 110 at section B-B of FIG. 1. In the illustrated embodiment, a thickness $T_1$ of the pads 120, 125 is substantially the same as a thickness $T_2$ Of the link 115. In some cases, however, it may be desirable to reduce the thickness of the link 115, e.g., to increase its resistance. FIG. 4B is a sectional view of a fin-fuse body 410 having such a thinned link 420. In this embodiment, the thinned link 420 has a thickness $T_3$ less than the thickness $T_1$. Methods of reducing the thickness of a fin of a finFET are known to those skilled in the art of finFET fabrication. A non-limiting example includes dry etch and thermal oxidation of the link 115. Thinning may be produced intentionally or may be incidental to thinning the fin 135 of the SOI transistor 105 for unrelated purposes.

Figure 5A:
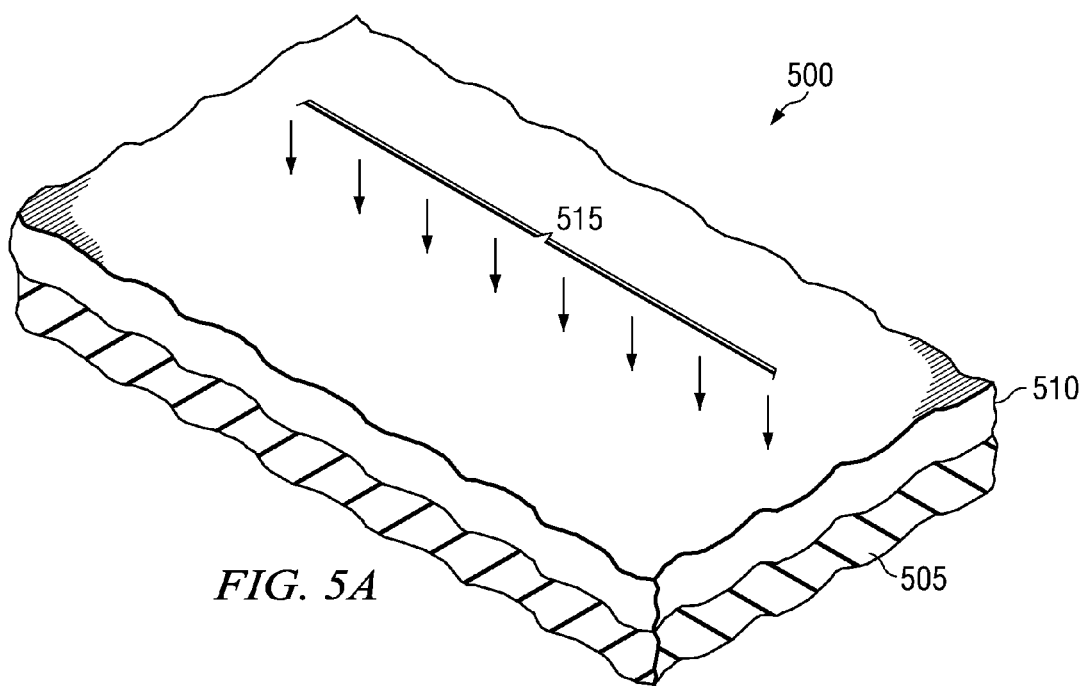
FIGS. 5A-5G illustrate a process sequence to form a fuse.

Another embodiment is a method of forming a fuse. FIGS. 5A-5G illustrate steps in an example process of forming a fuse 500. While the illustrated embodiment includes the use of a hardmask to form the fuse 200, the method is not so limited. In FIG. 5A, a dielectric layer 505 with a semiconductor layer 510 thereover is provided. As used herein, the dielectric layer 505 and the semiconductor layer 510 are provided when obtained from any source or formed by any currently existing or future discovered method. The semiconductor layer 510, which in one embodiment may be single-crystal material, may be optionally implanted with a dopant 515 to provide a desired resistivity. In one aspect, the dopant 515 is implanted in a manner that results in a substantially uniform concentration of the dopant in the pads and the fusible link of the fuse 500. In some embodiments, implantation of the dopant 515 causes a portion of the semiconductor layer 510 to become polycrystalline or amorphous. The implantation of the dopant 515 may be omitted when the resistivity of the semiconductor layer 510 meets design requirements without implantation.

Figure 5B:
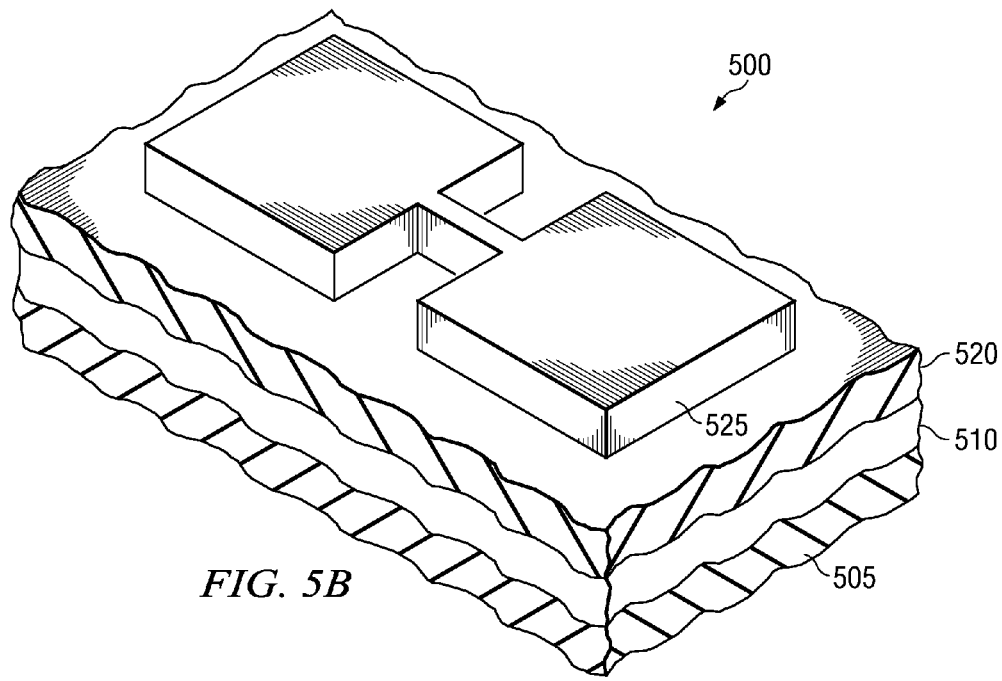

In FIG. 5B, a hardmask 520 has been formed over the semiconductor layer 510. The hardmask 520 may be conventionally formed of a dielectric material that is removed at a lower rate than the semiconductor layer 510 in a later process step. Examples of materials suitable for use as a hardmask 520 include silicon oxide, silicon nitride, and silicon carbide. A resist pattern 525 has been formed over the hardmask 520 to define the body of the fuse 500.

Figure 5C:
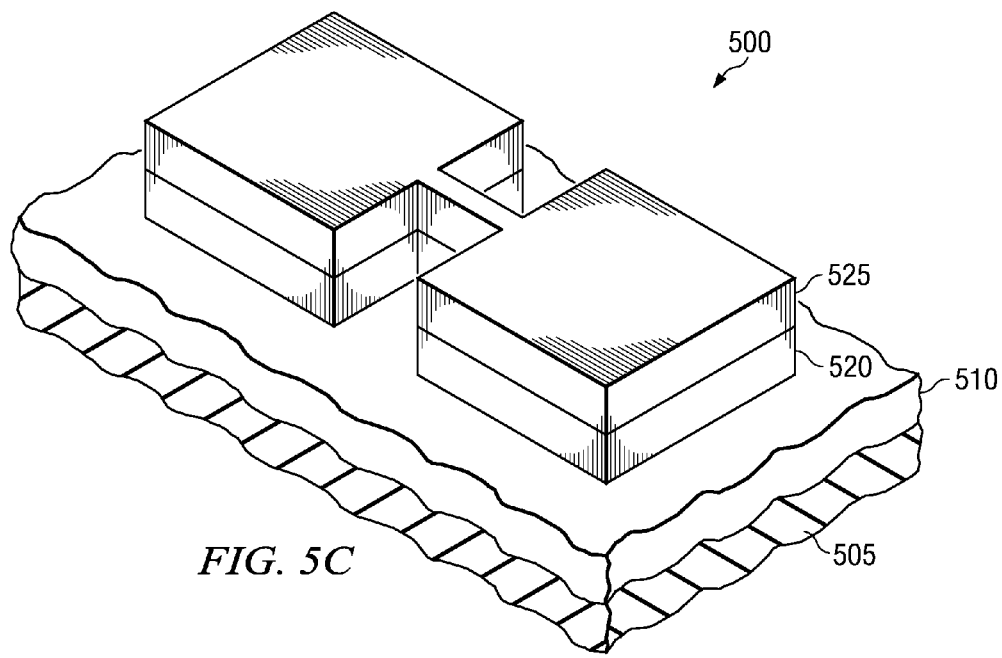

In FIG. 5C, the fuse pattern has been transferred from the resist pattern 525 to the hardmask 520 by, e.g., a plasma etch. Those skilled in the etch arts are familiar with the process tools and process parameters to effect the pattern transfer. The resist pattern 525 may be removed during the pattern transfer step or by a later ex-situ resist strip process (not shown).

Figure 5D:
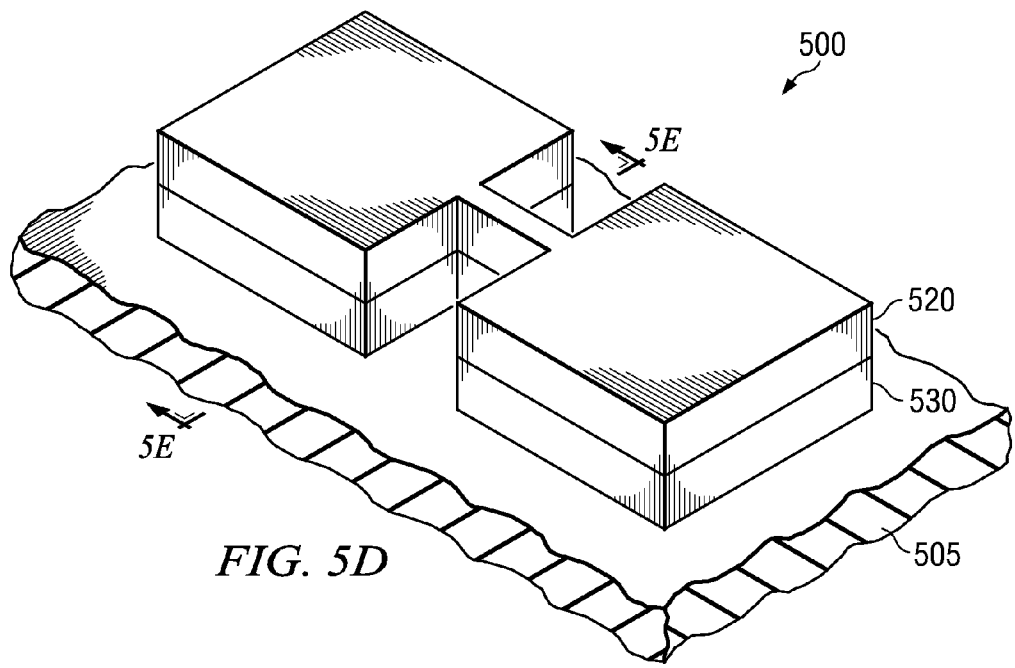

FIG. 5D illustrates the fuse 500 after transfer of the pattern from the hardmask 520 to the semiconductor layer 510 to form a fuse body 530. A plasma process may be used to achieve the pattern transfer, the details of which are dependent on the process tool used and layer thicknesses. The aforementioned difference in etch rate of the semiconductor layer 510 and the hardmask 520 may be employed to aid the pattern transfer. Those skilled in the art of etching are able to determine process specifications specific to available etch process tools and device geometries without undue experimentation.

Figure 5E:
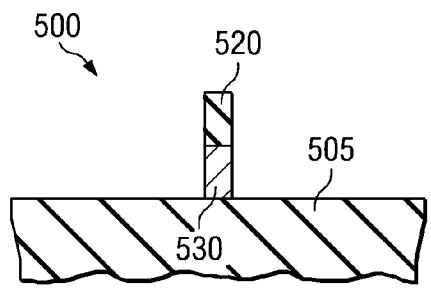
Figure 5F:
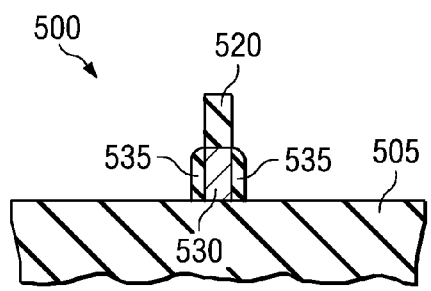
Figure 5G:
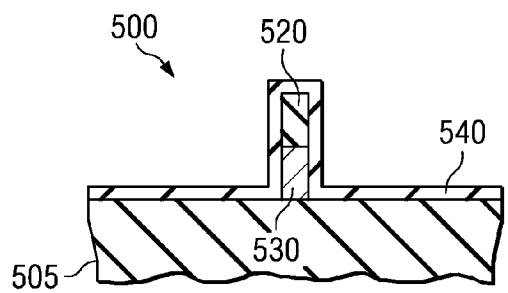

FIG. 5E illustrates a view of the fuse 500 at section A-A of FIG. 5D. Processing at this stage of manufacture may be coincident with the formation of a gate dielectric on finFETs being formed simultaneously on the dielectric layer 505. Two embodiments are shown of processing at this stage of manufacture. FIG. 5F illustrates the case in which a dielectric layer 535 is a gate oxide formed by thermal oxidation. In this embodiment, the dielectric layer 535 is formed on the sidewalls of the fuse body 530, but not on the hardmask 520. Alternatively, in an embodiment illustrated by FIG. 5G, a CVD process, e.g., may be used to form a dielectric layer 540. In this case, the dielectric layer 540 is a substantially continuous layer formed over the sidewalls of the fuse body 530, and vertical and horizontal surfaces of the hardmask 520 and a horizontal surface of the dielectric layer 505.

Figure 6:
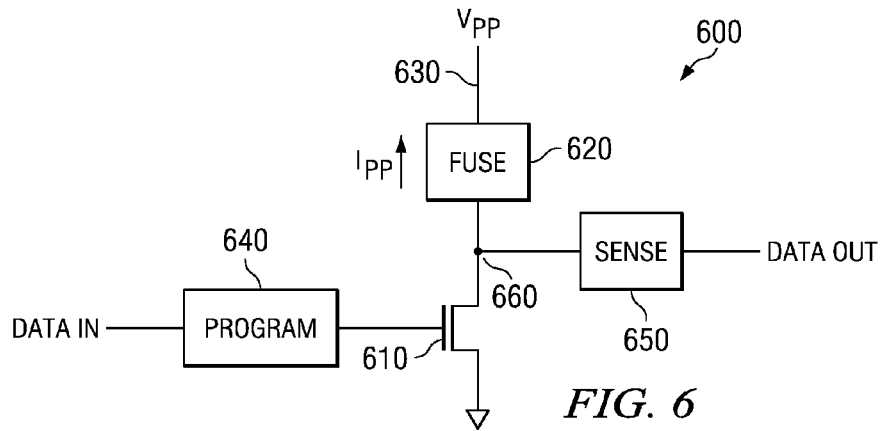
FIG. 6 illustrates a fuse circuit.

FIG. 6 illustrates a schematic embodiment of a block 600 of a semiconductor device including a sink transistor 610 and a fuse 620. One terminal of the fuse 620 may be connected to a voltage source 630, while another terminal may be connected to a source or a drain of the sink transistor 610. The fuse 620 and the sink transistor 610 may be fabricated of the same crystalline semiconductor level of the semiconductor device as described herein so that the resistivity of the fuse link scales with the unit drive capacity of the sink transistor 610. Other transistors in the semiconductor device are typically also fabricated of the same crystalline semiconductor level.

While the embodiment of FIG. 6 illustrates the use of the sink transistor 610, other configurations are possible and are contemplated. For example, one terminal of the fuse 620 may be connected to a current source, while another terminal of the fuse 620 is grounded. Furthermore, the sourcing or sinking of current through the fuse 620 may be provided by any combination of devices that includes at least one SOI transistor formed at least partially over and in contact with the SOI substrate.

The block 600 may also include a programming circuit 640 connected to a gate of the sink transistor 610 and a sense circuit 650 connected to a node 660. During programming, the voltage source 630 is typically set to a programming voltage, $V_{PP}$, while the sink transistor 610 is turned on by the programming circuit 640 to provide a low-resistance path to ground. The resulting current $I_{PP}$ results in local heating of the fuse link sufficient to create a high resistance state thereof. The state of the fuse 620 may then be determined by the sense circuit 650. Specific designs of the programming circuit 640 and sense circuit 650 are well-known to those skilled in the pertinent art. The programming circuit 640 may be omitted when the e-fuse 620 link is programmed by an external programming device or by a laser programming device.

Figure 7:
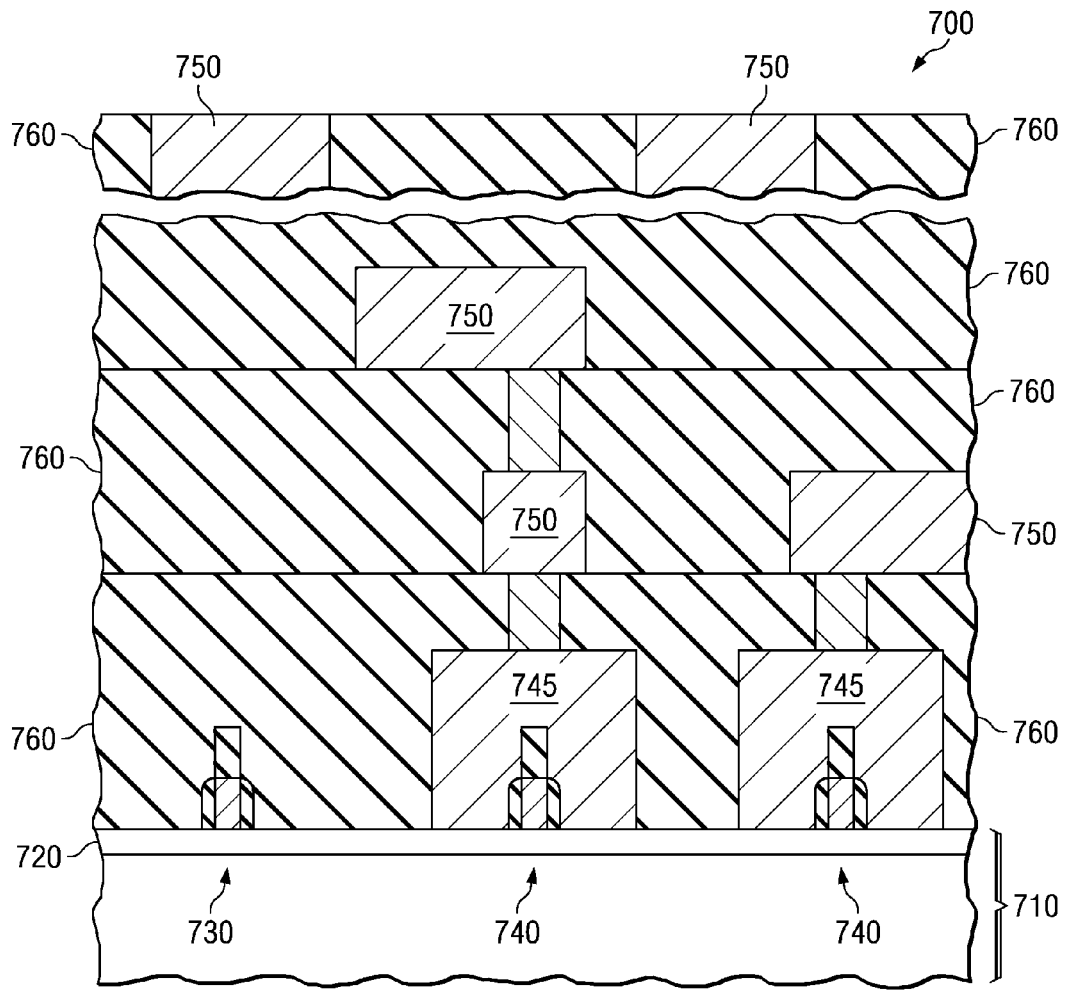
FIG. 7 illustrates an integrated circuit.

FIG. 7 illustrates a sectional view of a semiconductor device 700. The semiconductor device is formed on a substrate 710 having a dielectric layer 720 thereon, which may be a dielectric layer of an SOI substrate. A fuse 730 is formed of a crystalline semiconductor layer according to the method described herein. SOI transistors 740, illustrated as FinFETs, include gate electrodes 745, and are formed using the same crystalline semiconductor layer, such that the body of the fuse 730 and the body of the SOI transistor 740 have the same crystallographic orientation. The fuse 730 and the SOI transistors 740 are connected to other components of the semiconductor device 700 by interconnects 750 isolated by dielectric layers 760.

Those skilled in the art will appreciate that other and further additions, deletions, substitutions and modifications may be made to the described embodiments without departing from the scope the disclosure set forth herein.

What is claimed is:

1. A semiconductor device formed in a same process to include a finFET transistor and an electrically programmable fuse, comprising:
    a substrate including a first dielectric layer;
    a semiconductor layer formed over the first dielectric layer and patterned to provide a plurality of fins respectively extending between first and second pads; a first fin doped to define a finFET channel of given conductivity type extending between pads doped to define finFET source/drain regions of opposite conductivity type, and a second fin doped to define a fuse fusible link of one of the given or opposite conductivity type extending between pads doped to define fuse terminals of the same one of the given or opposite conductivity type;
    a second dielectric layer formed conformally over the first and second fins and over the respective first and second pads; and
    a gate electrode formed over the first dielectric layer and over the second dielectric layer over the finFET channel defined by the first fin.

2. The device of claim 1, wherein the semiconductor layer is a single-crystal semiconductor layer.

3. The device of claim 1, wherein the second fin defining the fuse fusible link is doped to have a substantially homogeneous concentration of dopant.

4. The device of claim 1, wherein the second fin defining the fuse fusible link and the pads defining the fuse terminals have a substantially uniform concentration of dopant.

5. The device of claim 1, wherein the second fin defining the fuse fusible link is connected to programming circuitry by a conductive path formed over the first dielectric layer.

6. The device of claim 1, wherein the second fin defining the fuse fusible link has a width that is less than a corresponding width of the pads defining the fuse terminals.

7. The device of claim 6, wherein the second fin defining the fuse fusible link has a thickness that is less than a corresponding thickness of the pads defining the fuse terminals.

8. The device of claim 1, wherein the second fin defining the fuse fusible link has a thickness that is less than a corresponding thickness of the pads defining the fuse terminals.

9. The device of claim 1, wherein one of the pads defining the fuse terminals is connected to a voltage source, and the other of the pads defining the fuse terminals is connected to one of the pads defining the finFET source/drain regions.

10. The device of claim 1, wherein one of the pads defining the fuse terminals is connected to a current source, and the other of the pads defining the fuse terminals is grounded.

11. A semiconductor device formed in a same process to include a finFET transistor and an electrically programmable fuse, comprising:
    a substrate including a first dielectric layer;
    a semiconductor layer formed over the first dielectric layer and patterned to provide a first fin doped to define a finFET channel of given conductivity type extending between first and second pads doped to define finFET source/drain regions of opposite conductivity type, and a second fin doped to define a fuse fusible link of one of the given or opposite conductivity;
    a second dielectric layer formed conformally over at least portions of the first and second fins; and
    a gate electrode formed over the first dielectric layer and over the second dielectric layer over the finFET channel defined by the first fin.

12. A semiconductor device formed in a same process to include a finFET transistor and an electrically programmable fuse, comprising:
    a semiconductor layer formed over a substrate and patterned to provide a first fin doped to define a finFET channel of given conductivity type extending between first and second pads doped to define finFET source/drain regions of opposite conductivity type, and a second fin doped to define a fuse fusible link of one of the given or opposite conductivity type;
    a dielectric layer formed conformally over at least portions of the first and second fins; and
    a gate electrode formed over the substrate and over the dielectric layer over the finFET channel defined by the first fin.

* * * * *